United States Patent
Andrews (10) Patent No.: US 10,156,875 B2
(45) Date of Patent: Dec. 18, 2018

(54) METHOD TO IDENTIFY COOLING MODULES ATTACHED TO A REFRIGERANT DISTRIBUTION UNIT IN A COOLING SYSTEM

(71) Applicant: SCHNEIDER ELECTRIC IT CORPORATION, West Kingston, RI (US)

(72) Inventor: Bibin Andrews, Kerala (IN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 265 days.

(21) Appl. No.: 14/895,033

(22) PCT Filed: Jun. 4, 2013

(86) PCT No.: PCT/US2013/044051
§ 371 (c)(1),
(2) Date: Dec. 1, 2015

(87) PCT Pub. No.: WO2014/196961
PCT Pub. Date: Dec. 11, 2014

(65) Prior Publication Data
US 2016/0116951 A1 Apr. 28, 2016

(51) Int. Cl.
*G06F 1/20* (2006.01)
*H05K 7/20* (2006.01)
*G05B 15/02* (2006.01)

(52) U.S. Cl.
CPC .............. *G06F 1/206* (2013.01); *G05B 15/02* (2013.01); *G06F 1/20* (2013.01); *H05K 7/20827* (2013.01)

(58) Field of Classification Search
CPC ...................................................... G05B 15/02
(Continued)

(56) References Cited

U.S. PATENT DOCUMENTS 5,187,797 A * 2/1993 Nielsen ................. G06F 3/0489
700/17
7,225,383 B1 * 5/2007 Wood ................. G06F 13/4265
370/252

(Continued)

FOREIGN PATENT DOCUMENTS

WO 2012047757 A1 4/2012

OTHER PUBLICATIONS

Ninagawa et al., "Automatic Unit Number Binding with Refrigeration Circuit Identification for Air-conditioner Control network", IEEJ Trans. IA, vol. 124, No. 9, 2004.*

(Continued)

*Primary Examiner* — Jason Lin
(74) *Attorney, Agent, or Firm* — Lando & Anastasi, LLP (57) ABSTRACT

Disclosed are systems and methods to facilitate the configuration of a cooling system including at least one the refrigerant distribution unit and cooling module. In one example, a method of configuring a cooling system comprises transmitting one or more signature parameters of a first pump pressure signature from a first refrigerant distribution unit to a cooling module, transmitting one or more identification parameters from the first refrigerant distribution unit to the cooling module, assigning the cooling module to the first refrigerant distribution unit responsive to the one or more identification parameters matching the one or more signature parameters.

19 Claims, 6 Drawing Sheets

(58) Field of Classification Search
USPC .......................................................... 700/282
See application file for complete search history.

(56) References Cited

U.S. PATENT DOCUMENTS

| | | | |
|---|---|---|---|
| 8,374,725 B1* | 2/2013 | Ols | F24F 11/0012 261/118 |
| 2006/0062158 A1* | 3/2006 | Hattig | H04L 12/2803 370/255 |
| 2007/0038414 A1 | 2/2007 | Rasmussen et al. | |
| 2008/0092577 A1 | 4/2008 | Martin | |
| 2008/0235774 A1* | 9/2008 | Tsuyuzaki | G07C 9/00309 726/7 |
| 2009/0217686 A1 | 9/2009 | Bittner | |
| 2009/0268404 A1 | 10/2009 | Chu et al. | |
| 2011/0052423 A1* | 3/2011 | Gambier | F04B 49/065 417/63 |
| 2011/0184580 A1* | 7/2011 | Kawamoto | H02J 3/14 700/295 |
| 2012/0221755 A1* | 8/2012 | Schultz | G05B 19/4185 710/110 |
| 2013/0027879 A1 | 1/2013 | Saal et al. | |

OTHER PUBLICATIONS

Extended European Search Report from corresponding European Application No. 13886540.7 dated Mar. 20, 2017.
Notification of Transmittal of the International Search Report and the Written Opinion of the International Searching Authority from corresponding PCT/US2013/044051 dated Nov. 1, 2013.

* cited by examiner

METHOD TO IDENTIFY COOLING MODULES ATTACHED TO A REFRIGERANT DISTRIBUTION UNIT IN A COOLING SYSTEM

CROSS-REFERENCE TO RELATED APPLICATIONS

This application is a U.S. National Stage Application under 35 U.S.C. § 371 of International Application No. PCT/US2013/044051, filed Jun. 4, 2013, titled METHOD TO IDENTIFY COOLING MODULES ATTACHED TO A REFRIGERANT DISTRIBUTION UNIT IN A COOLING SYSTEM, which is hereby incorporated herein by reference in its entirety.

BACKGROUND

1. Field of Disclosure

Aspects and embodiments of the present disclosure are generally directed to cooling systems and methods for the configuration and control of cooling systems. Some embodiments of a cooling system as disclosed herein may be utilized for maintaining desired temperatures in computer data centers.

2. Discussion of Related Art

In response to the increasing demands of information-based economies, information technology networks continue to proliferate across the globe. One manifestation of this growth is the centralized network data center. A centralized network data center typically includes various information technology equipment co-located in a structure that provides network connectivity, electrical power and cooling capacity. Often the equipment is housed in specialized enclosures termed "racks" which integrate these connectivity, power, and cooling elements. In some data center configurations, these rows are organized into hot and cold aisles to decrease the cost associated with cooling the information technology equipment.

Heat produced by rack-mounted equipment can have adverse effects on the performance, reliability and useful life of the equipment components. In particular, rack-mounted equipment, housed within an enclosure, may be vulnerable to heat build-up and hot spots produced within the confines of the enclosure during operation. The amount of heat generated by a rack of equipment is dependent on the amount of electrical power drawn by equipment in the rack during operation. In addition, users of electronic equipment may add, remove, and rearrange rack-mounted components as their needs change and new needs develop.

Data centers often include one or more cooling modules for use in cooling the environment and equipment in the data centers. One or more cooling modules may be supplied with coolant from a refrigerant distribution system. Cooling modules may be added, removed, or relocated upon addition, removal, or rearrangement rack-mounted components in a data center.

SUMMARY

In accordance with an aspect of the present disclosure, there is provided a method of configuring a cooling system. The cooling system may be a data center cooling system. The method comprises transmitting one or more signature parameters of a first pump signature from a first refrigerant distribution unit of the cooling system to a cooling module of the cooling system, transmitting one or more identification parameters from the first refrigerant distribution unit to the cooling module, and assigning the cooling module to the first refrigerant distribution unit responsive to the one or more identification parameters matching the one or more signature parameters.

In accordance with some embodiments, transmitting the one or more identification parameters from the first refrigerant distribution unit to the cooling module comprises performing an identification sequence including pumping coolant from the first refrigerant distribution unit in a coded manner to the cooling module.

In accordance with some embodiments, the method further comprises measuring one or more identification parameters of the identification sequence at the cooling module and comparing the one or more identification parameters with the one or more of the signature parameters.

In accordance with some embodiments, the method further comprises unassigning the cooling module from the first refrigerant distribution unit responsive to the one or more identification parameters not matching the one or more signature parameters.

In accordance with some embodiments, transmitting the one or more signature parameters comprises transmitting values for one or more of a pumping pressure to be supplied by the first refrigerant distribution unit during the identification sequence, a duration of the identification sequence, and a number of pumping cycles to be performed during the identification sequence.

In accordance with some embodiments, transmitting the one or more signature parameters comprises transmitting values for two or more of a pumping pressure to be supplied by the first refrigerant distribution unit during the identification sequence, a duration of the identification sequence, and a number of pumping cycles to be performed during the identification sequence.

In accordance with some embodiments, transmitting the one or more signature parameters comprises transmitting values for each of a pumping pressure to be supplied by the first refrigerant distribution unit during the identification sequence, a duration of the identification sequence, and a number of pumping cycles to be performed during the identification sequence.

In accordance with some embodiments, the method further comprises performing the identification sequence responsive to a request provided from the cooling module to the first refrigerant distribution unit.

In accordance with some embodiments, the method further comprises periodically resending the request from the cooling module to the first refrigerant distribution unit until the cooling module is assigned.

In accordance with some embodiments, the method further comprises providing the request from the cooling module to the first refrigerant distribution unit responsive to a boot up of the cooling module.

In accordance with some embodiments, the method further comprises performing the identification sequence responsive to a request manually provided on an interface of one of the first refrigerant distribution unit and the cooling module.

In accordance with some embodiments, the method further comprises performing a random selection on a controller of the first refrigerant distribution unit of one or more of the pumping pressure to be supplied by the refrigerant distribution unit during the identification sequence, the duration of the identification sequence, and the number of pumping cycles to be performed during the identification sequence.

In accordance with some embodiments, the method further comprises transmitting one or more signature parameters of a second pump signature from a second refrigerant distribution unit of the cooling system to the cooling module on a same communication bus as the signature parameters of the first pump pressure signature are transmitted, performing an identification sequence including pumping coolant from the second refrigerant distribution unit in a coded manner to the cooling module, measuring one or more identification parameters of the identification sequence at the cooling module, comparing one or more identification parameters of the identification sequence with the one or more of the signature parameters, and assigning the cooling module to the second refrigerant distribution unit responsive to the one or more identification parameters matching the one or more signature parameters.

In accordance with some embodiments, the method further comprises transmitting one or more signature parameters of the first pump signature from the first refrigerant distribution unit of the cooling system to a plurality of cooling modules of the cooling system, performing an identification sequence including pumping coolant from the first refrigerant distribution unit in a coded manner to one or more of the plurality of cooling modules, measuring one or more identification parameters of the identification sequence at the one or more of the plurality of cooling modules, comparing the one or more identification parameters with the one or more of the signature parameters, and assigning a cooling module included in the plurality of cooling modules to the first refrigerant distribution unit responsive to the one or more identification parameters measured at the cooling module included in the plurality of cooling modules matching the one or more signature parameters.

In accordance with another aspect of the present disclosure, there is provided a method of retrofitting a data system of a cooling system. The cooling system may be a data center cooling system. The method comprises programming a refrigerant distribution unit and a cooling module of the cooling system to perform a configuration algorithm including transmitting one or more signature parameters of a pump signature from the refrigerant distribution unit to the cooling module, transmitting one or more identification parameters from the first refrigerant distribution unit to the cooling module, and assigning the cooling module to the refrigerant distribution unit responsive to the one or more identification parameters matching the one or more signature parameters.

In accordance with some embodiments, the method further comprises programming the refrigerant distribution unit to perform an identification sequence including pumping coolant from the refrigerant distribution unit in a coded manner to the cooling module.

In accordance with some embodiments, the method further comprises programming the cooling module to measure one or more identification parameters of the identification sequence, and compare the one or more identification parameters with the one or more of the signature parameters.

In accordance with another aspect of the present disclosure, there is provided a cooling system. The cooling system may be a data center cooling system. The system comprises a refrigerant distribution unit and a cooling module, the refrigerant distribution unit and cooling module configured and programmed to perform a configuration algorithm including transmitting one or more signature parameters of a pump signature from the refrigerant distribution unit to the cooling module, transmitting one or more identification parameters from the first refrigerant distribution unit to the cooling module, and assigning the cooling module to the refrigerant distribution unit responsive to the one or more identification parameters matching the one or more signature parameters.

In accordance with some embodiments, the refrigerant distribution unit is further configured and programmed to perform an identification sequence including pumping coolant from the refrigerant distribution unit in a coded manner to the cooling module.

In accordance with some embodiments, the cooling module is further configured and programmed to measure one or more identification parameters of the identification sequence and compare the one or more identification parameters with the one or more of the signature parameters.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

This disclosure is not limited in its application to the details of construction and the arrangement of components set forth in the following description or illustrated in the drawings. Aspects of the present disclosure are capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein is meant to encompass the items listed thereafter and equivalents thereof as well as additional items.

In accordance with various aspects and embodiments disclosed herein, a cooling system for a data center may include at least one refrigerant distribution unit (RDU) that pumps refrigerant to one or more cooling modules (CMs) in the data center to maintain the temperature of equipment within the data center at a desired level. A data center may have more than one RDU and multiple CMs connected over a common control area network (CAN) bus for communication. The CAN bus may be an electrically wired bus, an optically coupled data transmission bus, or a wireless bus. In some embodiments, the cooling system is programmed to define groups of CMs from different RDUs and to operate the CMs of different groups as units to achieve precise control of temperature by each the groups. "Groups" are logical grouping of CMs that cool a particular area of a datacenter. Each group can have various set-points for the particular area of the datacenter, for example, cooling temperature. In some embodiments, a maximum of 15 CMs can be in a group. All CMs in a group need not be connected to the same RDU. The behavior of the CMs may be defined by the various group parameters, for example, fan speed, temperature, and humidity.

Aspects and embodiments of cooling systems including RDUs and CMs as disclosed herein may form efficient cooling solutions for data centers. In some embodiments, the RDUs pump liquefied refrigerant, for example, R134a refrigerant (National Refrigerants, Inc.) to the CMs where the refrigerant evaporates and provides cooling at the CMs. The CMs then return vaporized refrigerant back to the RDUs. The heat energy from the vaporized refrigerant is passed to chilled water at the RDUs and the refrigerant re-condenses into liquid form. This cycle continues to provide cooling to the data center.

In some embodiments, a CAN network to which one or more RDUs and CMs are connected may include one or more controllers electrically connected, either by wire or wirelessly, by a common CAN bus. In some embodiments, the controllers may include processors or programmable logic controllers and associated memories assigned to one or all of the RDUs and CMs in the cooling system. Each RDU and CM in a cooling system may include its own controller, or controllers may be shared among multiple RDUs and/or CMs. The controllers may be physically present within the RDUs and CMs, or may be located remote from the individual RDUs and CMs. In some embodiments, a control interface may be provided through which a user may access information regarding the operation of the cooling system and/or enter commands to modify the operation of the system and/or configure the system. Sensors, for example, air flow and/or temperature sensors may be present at various locations within the data center and may provide signals to one or more controllers on the CAN network. Responsive to the signals received from the various sensors, the controllers on the CAN network may issue commands to change parameters of the operation of one or more RDUs and/or CMs, for example, coolant pumping speed, or of one or more air flow devices within the data center to achieve a desired temperature and/or air flow at the equipment within the data center. In some embodiments, controllers present on or associated with one or more CMs in the cooling system may provide request signals to RDUs to which the CMs are connected to increase or decrease the amount of coolant supplied to the CMs to achieve a desired temperature in a region proximate the one or more CMs.

In some cooling systems the inability of the systems to automatically identify CMs connected to specific RDUs presents a challenge. In some cooling systems, upon the installation or reconfiguration of the cooling system a field service engineer must manually configure the CMs in the network to associate the CMs with the RDUs to which they are physically connected in the control software of the system. In some systems this involves identifying a CM by an identification number and manually assigning the CM to a corresponding RDU by typing the identification number of the CM into an interface of the system, for example, on an RDU to which the CM is connected. Disadvantages of this procedure include, for example, the time required for the manual configuration and the chance for human errors which could result in the CMs being assigned to and communicating with incorrect parent RDUs. Such cooling systems are often difficult to troubleshoot in the field and may provide no way for the system to identify an incorrect configuration and/or trigger an alert.

Some aspects and embodiments disclosed herein address at least some of the problems associated with prior cooling systems by providing for an RDU to automatically identify a CM or CMs physically connected to the RDU. Some aspects and embodiments disclosed herein may provide for easier and faster commissioning while providing for a reduction in errors during the commissioning of cooling systems in the field, may provide an alarm if an incorrect configuration is attempted, and/or may reduce other sources of error or difficulties in the configuration of cooling systems.

In some embodiments, a CAN network for a cooling system may include, for example, 4 RDUs and 60 CMs (15 CMs per RDU) which may be grouped under, for example, 15 groups. Different cooling systems may include more or fewer than 4 RDUs, 60 CMs, and/or 15 groups of CMs. Each RDU and CM may be identified by unique RDU identification numbers (RDU IDs) and CM identification numbers (CMIDs). In some embodiments, RDU IDs are hexadecimal, having values from 1-F and CMIDs are a combination of 3 hexadecimal digits derived from an associated RDU identification number, a group number to which CM belongs, and a CM number as shown in Table 1 below:

TABLE 1

| RDU ID | Group # | CM # | CMID (3 digits) |
|---|---|---|---|
| 1 | 2 | F | 12F |

The CMIDs may be converted to corresponding ECP-e addresses Enhanced CAN Protocol-efficient (ECP-e) addresses on a CAN bus for communication. ECP-e is a communication protocol which may be utilized on a CAN bus which provides options to prioritize messages on the bus, supports FTP, and supports 1 byte node address and 8 ports. Other communication protocols may alternatively or additionally be used in some embodiments. Embodiments disclosed herein are not limited to any particular CAN bus communication protocol.

The child CMs may identify their parent RDU from the first digit of their CMIDs. The CMs may use the first digit of their CMIDs to determine to which parent RDU communication requests should be sent. Network management cards (NMC cards) on the parent RDUs may be responsible for monitoring communication from the CMs, for the configuration of the child CMs, and for firmware upgrades over the CAN bus.

Figure 1:
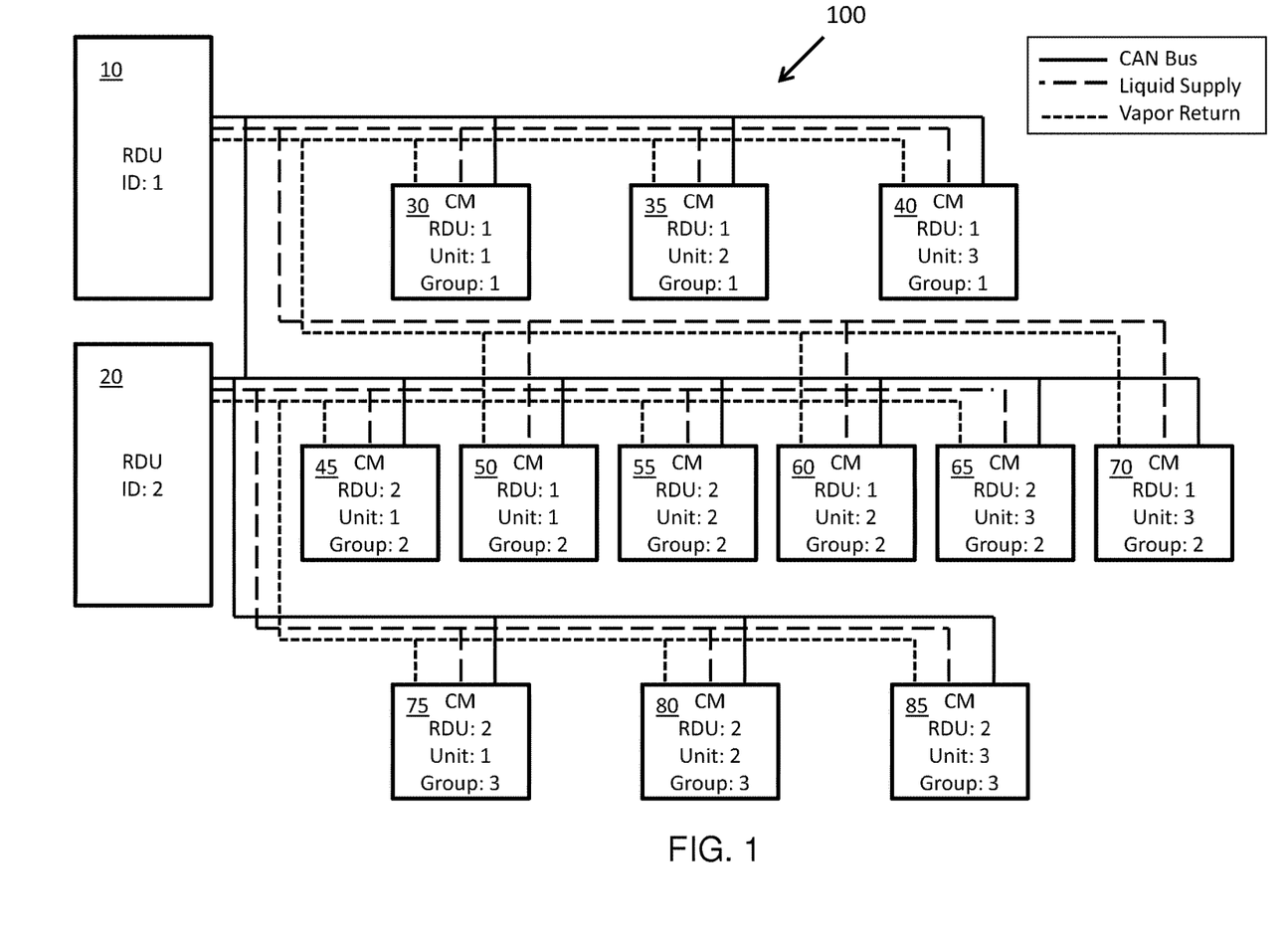
FIG. 1 is a schematic illustration of a cooling system.

FIG. 1 illustrates an embodiment of a cooling system, indicated generally at 100, which includes multiple RDUs and CMs in multiple groups. The system includes 2 RDUs and their respective NMC cards and 12 CMs connected on the same CAN bus. The CMs communicate with their parent RDUs which are identified by the first digit (RDU ID) on the CMID.

In system 100, RDU 10, having RDU ID 1, supplies refrigerant to CMs 30, 35, 40, 50, 60, and 70, having CMIDs 111, 112, 113, 121, 122, and 123, respectively. RDU 20, having RDU ID 2, supplies refrigerant to CMs 45, 55, 65, 70, 80, and 85 having CMIDs 221, 222, 223, 231, 232, and 233, respectively. The CMIDs are a concatenation of the RDU number, Group number, and Unit number indicated in each CM in FIG. 1.

In many data center cooling systems, during the commissioning of the cooling system, a field service engineer may connect chiller inlet and outlet pipes to each of the RDUs and connect each of the CMs to coolant supply and return ducts of the RDUs. Electrical connections, for example, power, may be made to all RDUs and CMs. All the RDUs and CMs may be connected to the same CAN bus.

During the powerup of an unconfigured RDU, for example, an initial powerup of a newly installed or relocated RDU, a field service engineer may assign and enter the RDU ID into, for example, an interface of the RDU. The RDU IDs for each RDU in the system should be unique. CMs which are not assigned to specific RDUs (unconfigured CMs), for example, newly installed or relocated CMs, may be identified by 2 digit auto generated CAN addresses which identify the CMs on the CAN network. In some embodiments, the address is automatically generated from the serial number (which is unique) of each individual CM. This ensures that the ECP-e address for each CM shall be unique in the network. The CMID (which includes the CM number, Group number, and associated RDU number) may be configured by a field service engineer manually. In some embodiments, there may be an option provided on a RDU local display to view all the CMs that are not assigned (CMs that are on the CAN bus, but no CMIDs assigned). Any unconfigured CM may advertise itself on the bus, and the RDU may list them in the local display.

In some previous systems any RDU can view all the CMs in the network and assign any CMs on the CAN bus. An assignment of an incorrect parent RDU in the CM can result in issues.

Aspects and embodiments of the present disclosure include systems and methods for automatically identifying CMs that are physically attached, for example, by coolant supply and vapor return lines, to which RDUs in a cooling system. In some embodiments, the method may be implemented in an existing cooling system without the need for any hardware changes to existing RDUs or CMs. In some embodiments, there is provided a firmware algorithm which defines an efficient identification method. In one embodiment, the method includes sensing a pressure signal from the RDU(s) of a cooling system at refrigerant pressure sensors in the CMs of the system. Some embodiments may include operating the RDU refrigerant pump in a coded fashion, which a CM may monitor and/or record and analyze to determine the RDU to which it is attached.

In some embodiments of the method disclosed herein, when an RDU boots up, the RDU waits for identification requests from the CMs in the cooling system. Alternatively or additionally, a user may trigger an identification algorithm manually from an interface of an RDU or CM. Responsive to the receipt of an identification request or a manual initiation of the identification algorithm, the RDU may start the identification sequence through which a CM is able to identify the parent RDU to which it is physically piped.

Figure 2:
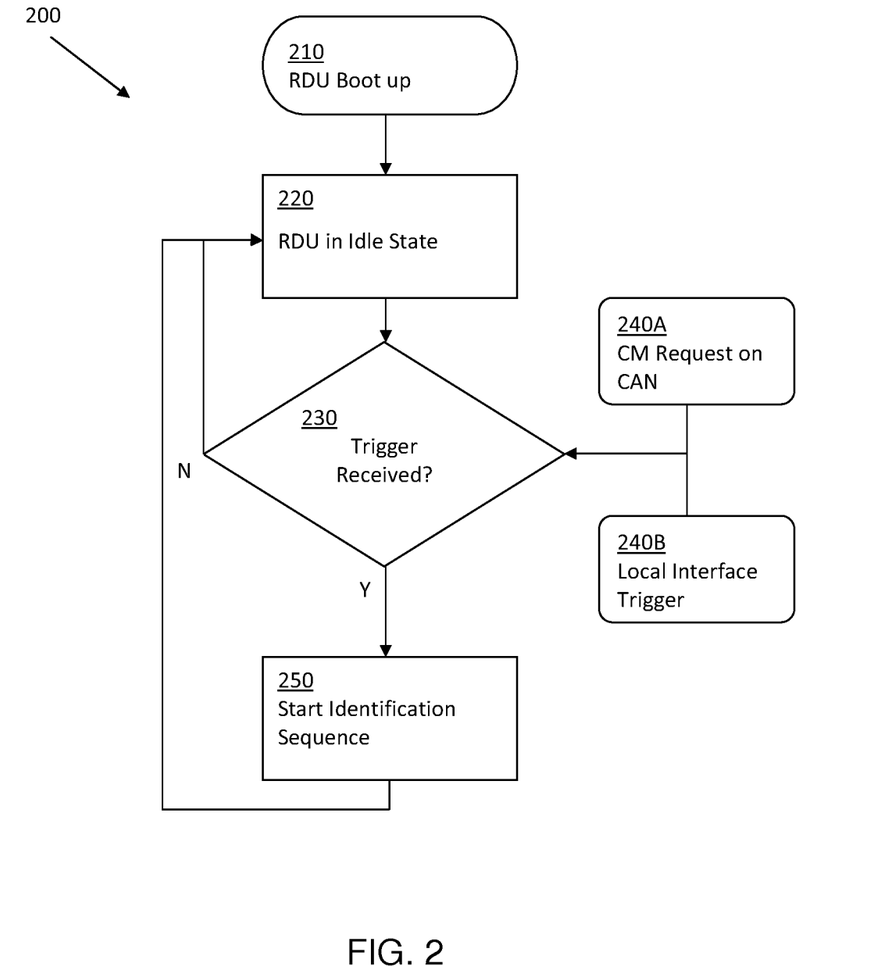
FIG. 2 is a flowchart of a method in accordance with an embodiment of the present disclosure.

In some embodiments, as illustrated in the flowchart FIG. 2, indicated generally at 200, upon the boot up of an RDU (act 210), the RDU waits, either in an idle state (act 220), or while performing an alternative task (not shown) for an identification sequence trigger signal from a CM, for example, as a CAN message broadcast by the CM (act 240A) or a user trigger from a local interface of the RDU (act 240B). In some embodiments, a user may manually instruct a CM to transmit an identification sequence trigger signal from an interface of the CM. After receiving a trigger signal (decision act 230) the RDU starts the identification sequence (act 250). After completion of the identification sequence the RDU may return back to an idle state (act 220) or may perform alternate tasks, waiting for additional trigger signals (decision act 230).

Figure 3:
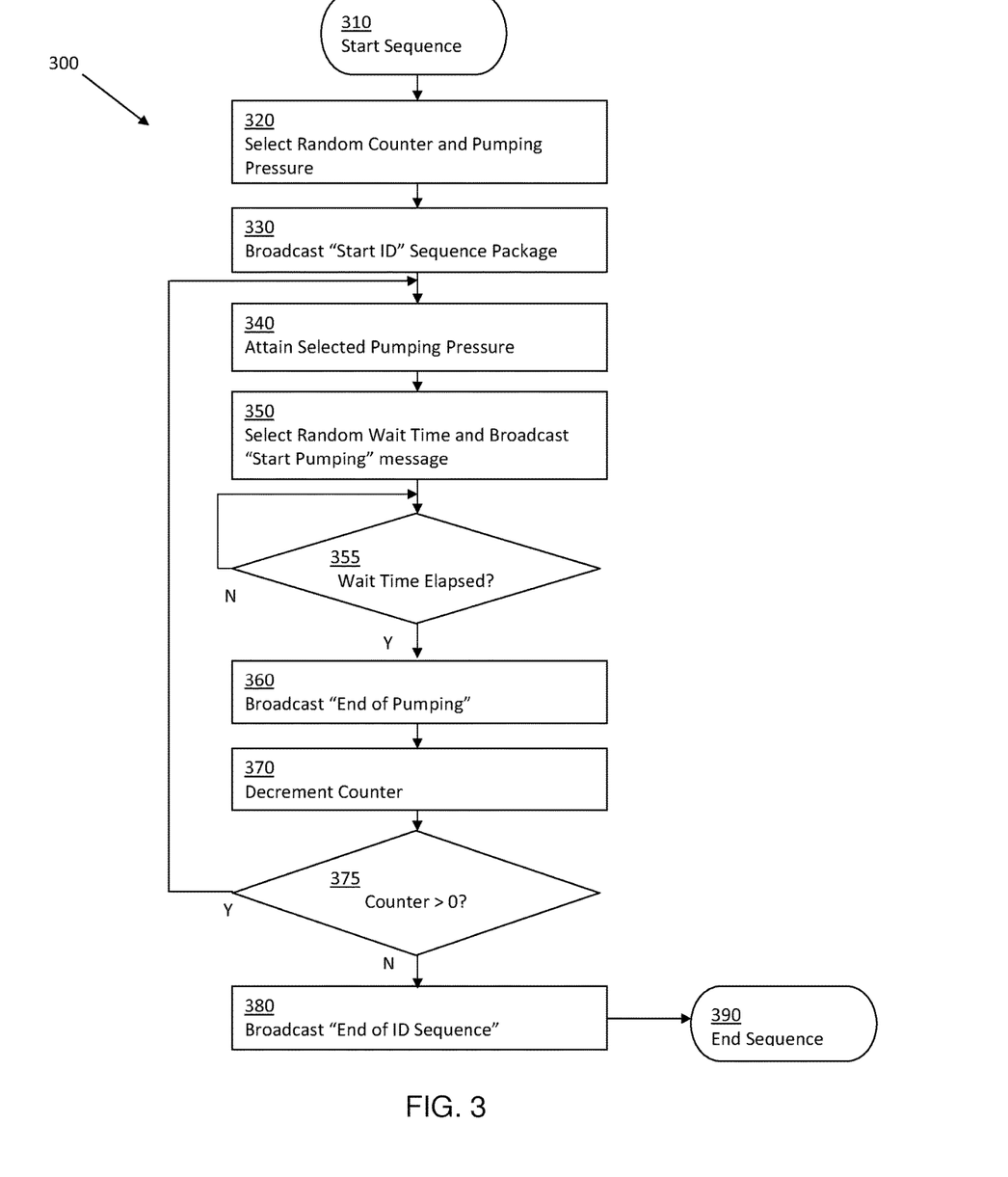
FIG. 3 is a flowchart of a method in accordance with an embodiment of the present disclosure.

An embodiment of an identification sequence which may be performed by an RDU is illustrated in the flowchart of FIG. 3, indicated generally at 300. After receiving a valid trigger (decision act 230 of FIG. 2), the RDU initiates the identification sequence (act 310), which includes defining and broadcasting a signal indicative of a "Pumping Signature." In one embodiment the "Pumping Signature" is a unique combination of one or more of a defined pumping pressure, a defined pumping duration, and a defined number of pumping cycles. The values of one or more of the pumping pressure, pumping duration, and number of pumping cycles may be randomly selected by the RDU between values in pre-defined ranges. For example, in act 320 the RDU may randomly select a pumping pressure, which may be close to or the same as a pumping pressure at which the RDU may be operating, and which may include either a positive or negative offset (or no offset). Alternatively, the values of one or more of the pumping pressure, pumping duration, and number of pumping cycles for use in the identification sequence may be pre-defined for a particular RDU.

The RDU may also randomly select a "Pumping Cycle Counter" in act 320 with value between, for example, three and seven. Values greater or lesser than these may be utilized in some embodiments. A start of identification "START ID" packet is broadcast, for example, by the RDU, over the CAN bus to all CMs connected to the CAN bus (act 330). The RDU then attains the selected pumping pressure (act 340). A random pumping duration is selected by the RDU with a value of between, for example, about one and about four seconds (although values greater or lesser than these may be utilized in some embodiments) and a "Start Pumping" message is broadcast by the RDU to all CMs (act 350). The selected Pumping Cycle Counter, pumping pressure, and pumping duration may be included in the "Start Pumping" message, or may be transmitted over the CAN bus in a separate message or messages.

The RDU pumps coolant at the selected pumping pressure for the selected pumping duration (act 355). After the pumping duration has elapsed, the RDU broadcasts an "End of Pumping" signal as another CAN message (act 360). The RDU repeats the sequence of acts 340-370 until the randomly selected number of pumping cycles are completed (act 375). In some embodiments, the pumping pressure and/or pumping duration is the same for each cycle and in other embodiments the pumping pressure and/or pumping duration may vary from one cycle to another. After completing all of the pumping cycles the RDU broadcasts an "End of ID Sequence" message over the CAN network (act 380) and the identification sequence comes to an end (act 390).

Figure 4:
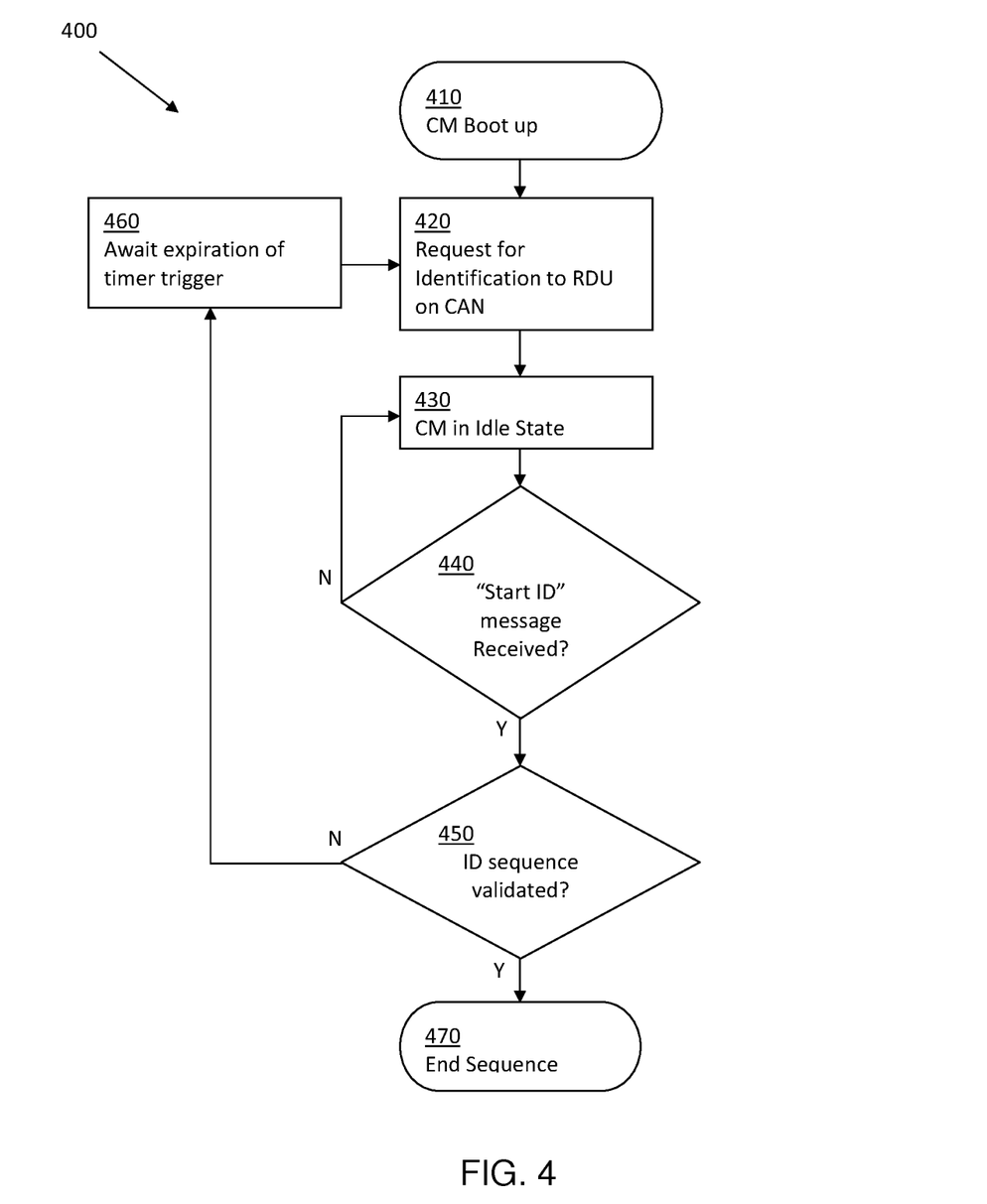
FIG. 4 is a flowchart of a method in accordance with an embodiment of the present disclosure.

A sequence of actions taken by a CM during boot up in accordance with some embodiments is illustrated in the flowchart of FIG. 4, indicated generally at 400. Upon CM boot up (act 410) the CM triggers a request for identification of its parent RDU by broadcasting a CAN packet (act 420). The CM enters an idle state (act 430) and waits for an RDU "Start ID" message (act 440). On reception of the "Start ID" message, which may the "Start ID" message broadcast by the RDU in act 330 of the flowchart FIG. 3, the CM records the parameters of the identification sequence and attempts to validate the identification sequence (act 450). The CM resends the identification request periodically at a time intervals defined by a timer trigger (act 460) until successful parent identification. The time intervals may be, for example, about five minutes. Responsive to successful parent identification the sequence comes to an end (act 470). The CM may then again wait for a "Start ID" message from an RDU so that the correct RDU to which the CM is connected may be verified or reassigned if the CM has been moved or the cooling system has been reconfigured.

Figure 5A:
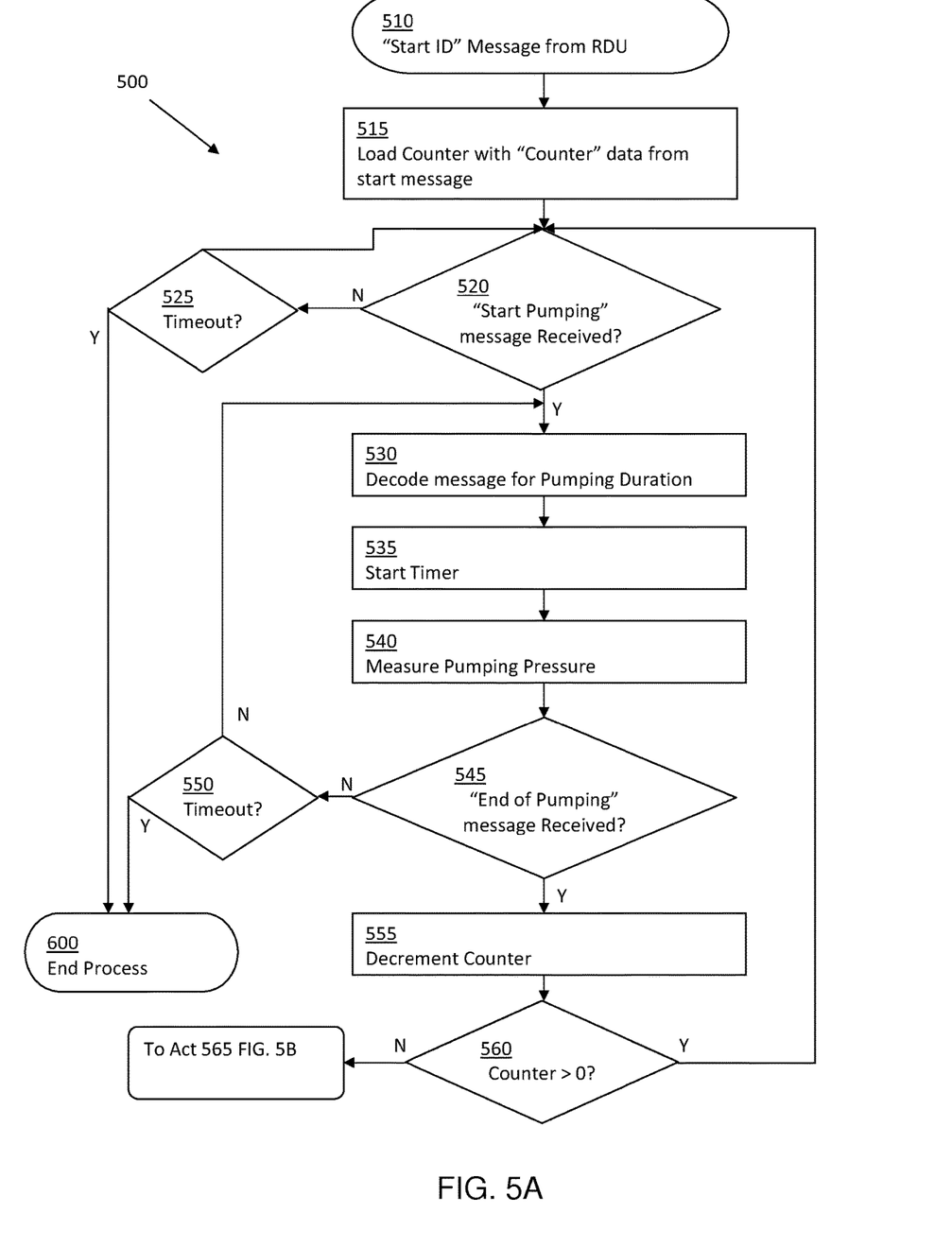
FIG. 5A is a flowchart of a method in accordance with an embodiment of the present disclosure.
Figure 5B:
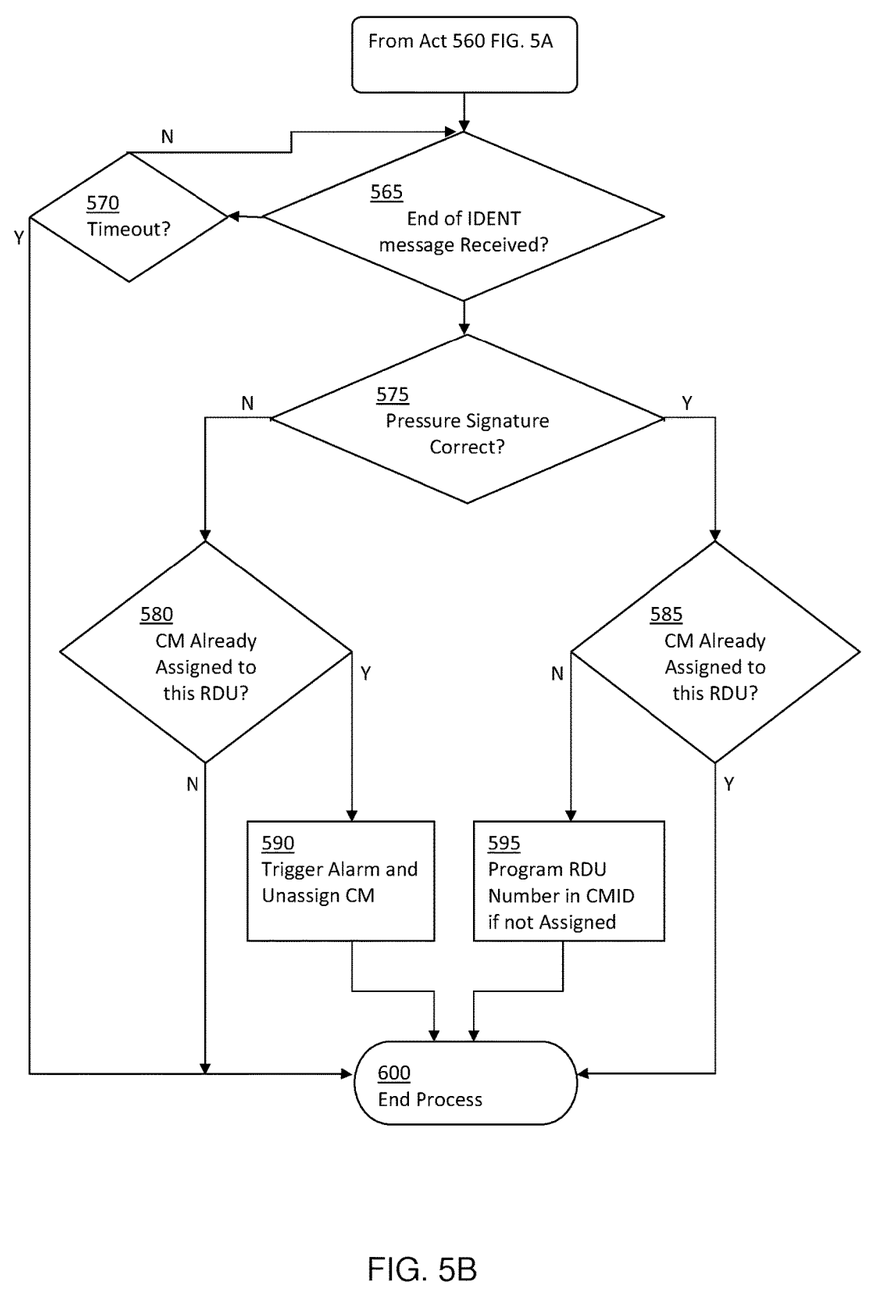
FIG. 5B is a continuation of the flowchart of FIG. 5A.

A sequence of actions taken by a CM to associate the CM with a proper RDU is illustrated in the flowchart of FIGS. 5A and 5B, indicated generally at 500. In a first act (act 510) the CM waits for a "Start ID" message from an RDU. The "Start ID" message may be the message broadcast by the RDU over the CAN network in act 330 of the flowchart of FIG. 3. The CM decodes the "Start ID" message and obtains a pumping cycle counter value which may be loaded into a memory of a controller of the CM (act 515).

The CM then waits for a "Start Pumping" message from the RDU (act 520). The "Start Pumping" message may be the message broadcast by the RDU over the CAN network in act 350 of the flowchart of FIG. 3. In some embodiments, if the "Start Pumping" message is not received within a pre-specified time limit, for example, about 30 seconds, the process 500 may timeout (act 525) and end (act 600).

Responsive to reception of the "Start Pumping" message from the RDU, the CM processes or decodes the message to obtain the pumping duration value embedded in the "Start Pumping" message (act 530). The CM then starts a pumping duration timer to count down the pumping duration (act 535) and measures and records the pumping pressure applied to the coolant delivered by the RDU (act 540).

The CM waits for an "End of Pumping" message from the RDU (act 545). The "End of Pumping" message may be the message broadcast by the RDU over the CAN network in act 360 of the flowchart of FIG. 3. In some embodiments, if the "End of Pumping" message is not received within a pre-specified time limit defined by the pumping duration obtained from the "Start Pumping" message, the process 500 may timeout (act 550) and end (act 600). The pre-specified time limit may be the pumping duration obtained from the "Start Pumping" message plus a small buffer, for example about 5% of the pumping duration. Responsive to receipt of the "End of Pumping" message, the CM records the pumping duration indicated by the pumping duration timer.

The CM repeats the identification process until the number of pumping cycles indicated by the pumping cycle counter value derived from the "Start ID" message have been completed (acts 555 and 560). The CM waits for an "END of ID Sequence" message from the RDU (act 565). The "End of ID Sequence" message may be the message broadcast by the RDU over the CAN network in act 380 of the flowchart of FIG. 3. In some embodiments, if the "END of ID Sequence" message is not received within a pre-specified time limit, for example, about ten seconds, the process 500 may timeout (act 570) and end (act 600).

The pumping pressure signature is validated by the CM by comparing the pumping pressure(s), pumping duration(s), and number of pumping cycles observed with the values for these parameters previously received over the CAN network from the RDU (act 575). In some embodiments, the pumping pressure(s) and/or pumping duration(s) recorded during by the CM during the identification sequence may be considered to match the pumping pressure(s) and/or pumping duration(s) of the pumping pressure signature if the observed parameters are within, for example, about 5% of the values indicated in the pumping pressure signature.

If an invalid pumping pressure signature is received from a parent RDU to which the CM is assigned (act 580), for example, if one or more of the number of pumping cycles, pumping cycle durations, or pumping pressures observed do not match those previously provided to the CM by the RDU during the process 500, this may be indicative of an incorrect assignment between the RDU and CM having been made. Responsive to an incorrect RDU-CM assignment having been made the CM (and/or the RDU) triggers an alarm and the CM unassigns itself from the parent RDU (act 590). A pumping pressure signature which is validated on a previously unassigned CM or to a CM previous assigned to another RDU ("no" branch of decision act 585) causes the parent RDU number to be programmed into the CMID of the previously unassigned CM (act 595) and the CMID to be added into the display of the parent RDU.

Although described herein with reference to data center cooling systems, it should be appreciated that embodiments of the cooling system and methods disclosed herein may be utilized in other environments as well, for example, in an office building, municipal building, or home cooling system. Embodiments of the systems and methods disclosed herein may be utilized in new installations of cooling systems or may utilized in existing cooling systems as a retrofit.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method of configuring a cooling system, the method comprising:
    transmitting one or more signature parameters of a first pump signature from a first refrigerant distribution unit of the cooling system to a cooling module of the cooling system, the one or more signature parameters including one or more of a value of a pumping pressure to be supplied by the first refrigerant distribution unit during an identification sequence, a duration of pumping cycles to performed during the identification sequence, and a number of pumping cycles to be performed during the identification sequence;
    transmitting one or more identification parameters from the first refrigerant distribution unit to the cooling module; and
    assigning the cooling module to the first refrigerant distribution unit responsive to the one or more identification parameters matching the one or more signature parameters.

2. The method of claim 1, wherein transmitting the one or more identification parameters from the first refrigerant distribution unit to the cooling module comprises performing the identification sequence, the identification sequence including pumping coolant from the first refrigerant distribution unit in a coded manner to the cooling module.

3. The method of claim 2, further comprising:
    measuring one or more identification parameters of the identification sequence at the cooling module; and
    comparing the one or more identification parameters with the one or more of the signature parameters.

4. The method of claim 3, further comprising unassigning the cooling module from the first refrigerant distribution unit responsive to the one or more identification parameters not matching the one or more signature parameters.

5. The method of claim 1, wherein transmitting the one or more signature parameters comprises transmitting values for two or more of the pumping pressure to be supplied by the first refrigerant distribution unit during the identification sequence, the duration of the pumping cycles, and the number of pumping cycles to be performed during the identification sequence.

6. The method of claim 5, wherein transmitting the one or more signature parameters comprises transmitting values for each of the pumping pressure to be supplied by the first refrigerant distribution unit during the identification sequence, the duration of the pumping cycles, and the number of pumping cycles to be performed during the identification sequence.

7. The method of claim 6, further comprising periodically resending the request from the cooling module to the first refrigerant distribution unit until the cooling module is assigned.

8. The method of claim 1, further comprising performing the identification sequence responsive to a request provided from the cooling module to the first refrigerant distribution unit.

9. The method of claim 8, further comprising providing the request from the cooling module to the first refrigerant distribution unit responsive to a boot up of the cooling module.

10. The method of claim 1, further comprising performing the identification sequence responsive to a request manually provided on an interface of one of the first refrigerant distribution unit and the cooling module.

11. The method of claim 1, further comprising performing a random selection on a controller of the first refrigerant distribution unit of one or more of the pumping pressure to be supplied by the refrigerant distribution unit during the identification sequence, the duration of the pumping cycles, and the number of pumping cycles to be performed during the identification sequence.

12. The method of claim 1, further comprising:
transmitting one or more signature parameters of a second pump signature from a second refrigerant distribution unit of the cooling system to the cooling module on a same communication bus as the signature parameters of the first pump pressure signature are transmitted;
performing an identification sequence including pumping coolant from the second refrigerant distribution unit in a coded manner to the cooling module;
measuring one or more identification parameters of the identification sequence at the cooling module;
comparing one or more identification parameters of the identification sequence with the one or more of the signature parameters of the second pump signature; and
assigning the cooling module to the second refrigerant distribution unit responsive to the one or more identification parameters matching the one or more signature parameters of the second pump signature.

13. The method of claim 1, further comprising:
transmitting one or more signature parameters of the first pump signature from the first refrigerant distribution unit of the cooling system to a plurality of cooling modules of the cooling system;
performing an identification sequence including pumping coolant from the first refrigerant distribution unit in a coded manner to one or more of the plurality of cooling modules;
measuring one or more identification parameters of the identification sequence at the one or more of the plurality of cooling modules;
comparing the one or more identification parameters with the one or more of the signature parameters; and
assigning a cooling module included in the plurality of cooling modules to the first refrigerant distribution unit responsive to the one or more identification parameters measured at the cooling module included in the plurality of cooling modules matching the one or more signature parameters.

14. A method of retrofitting a data system of a cooling system, the method comprising:
programming a refrigerant distribution unit and a cooling module of the cooling system to perform a configuration algorithm including:
transmitting one or more signature parameters of a pump signature from the refrigerant distribution unit to the cooling module, the one or more signature parameters including one or more of a value of a pumping pressure to be supplied by the refrigerant distribution unit during an identification sequence, a duration of pumping cycles to performed during the identification sequence, and a number of pumping cycles to be performed during the identification sequence;
transmitting one or more identification parameters from the first refrigerant distribution unit to the cooling module; and
assigning the cooling module to the refrigerant distribution unit responsive to the one or more identification parameters matching the one or more signature parameters.

15. The method of claim 14, further comprising programming the refrigerant distribution unit to perform the identification sequence, the identification sequence including pumping coolant from the refrigerant distribution unit in a coded manner to the cooling module.

16. The method of claim 15, further comprising programming the cooling module to:
measure one or more identification parameters of the identification sequence; and
compare the one or more identification parameters with the one or more of the signature parameters.

17. A cooling system comprising:
a refrigerant distribution unit and a cooling module, the refrigerant distribution unit and cooling module configured and programmed to perform a configuration algorithm including:
transmitting one or more signature parameters of a pump signature from the refrigerant distribution unit to the cooling module, the one or more signature parameters including one or more of a value of a pumping pressure to be supplied by the refrigerant distribution unit during an identification sequence, a duration of pumping cycles to performed during the identification sequence, and a number of pumping cycles to be performed during the identification sequence;
transmitting one or more identification parameters from the first refrigerant distribution unit to the cooling module; and
assigning the cooling module to the refrigerant distribution unit responsive to the one or more identification parameters matching the one or more signature parameters.

18. The system of claim 17, wherein the refrigerant distribution unit is further configured and programmed to perform the identification sequence, the identification sequence including pumping coolant from the refrigerant distribution unit in a coded manner to the cooling module.

19. The system of claim 18, wherein the cooling module is further configured and programmed to:
measure one or more identification parameters of the identification sequence; and compare the one or more identification parameters with the one or more of the signature parameters.

* * * * *